United States Patent [19]

Stormont et al.

[11] Patent Number: 4,952,877
[45] Date of Patent: Aug. 28, 1990

[54] RF SYNTHESIZER FOR AN NMR INSTRUMENT

[75] Inventors: Robert S. Stormont, Waukesha; Jeffrey P. Noonan, Dousman; Norbert J. Pelc, Wauwatosa, all of Wis.

[73] Assignee: General Electric Company, Milwaukee, Wis.

[21] Appl. No.: 392,692

[22] Filed: Aug. 11, 1989

[51] Int. Cl.$^5$ ............................................. G01R 33/20
[52] U.S. Cl. .................................... 324/312; 324/307
[58] Field of Search ............... 324/300, 307, 309, 312, 324/313, 314, 318, 322, 77 R, 77 B, 77 D, 77 G; 128/653; 328/14; 331/2

[56] References Cited

U.S. PATENT DOCUMENTS

| | | |
|---|---|---|
| 4,659,999 | 4/1987 | Motoyama et al. ...................... 331/2 |
| 4,792,914 | 12/1988 | Dartois ................................... 328/14 |
| 4,879,514 | 11/1989 | Mehlkopf et al. ................... 324/314 |

OTHER PUBLICATIONS

Dye J. Jensen et al., "An Incremental Phase Shifter and Frequency Modulator for Magnetic Resonance Imaging and Spectroscopy", IEEE Transactions on Biomedical Engineering, vol. BME-34, No. 4, pp. 310, 311, 312, and 313, Apr., 1987.

Primary Examiner—Michael J. Tokar
Attorney, Agent, or Firm—Quarles & Brady

[57] ABSTRACT

The transceiver of an NRM instrument includes a digital synthesizer that produces an analog carrier signal which can be controlled in both frequency and phase and which can be frequency and phase modulated. The analog carrier signal is mixed with reference signals to boost its frequency to the Larmor frequency of the instrument.

6 Claims, 5 Drawing Sheets

TIME

FIG. 5B

RF SYNTHESIZER FOR AN NMR INSTRUMENT

BACKGROUND OF THE INVENTION

The field of the invention is nuclear magnetic resonance methods and systems. More particularly, the invention relates to an RF synthesizer and transmitter for producing RF excitation pulses having a precise frequency and phase, and a receiver for accurately receiving and digitizing the resulting NMR signals.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomenon are referred to herein as "spins".

When a substance such as human tissue is subjected to a uniform magnetic field (polarizing field $B_o$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence, the magnitude of the net transverse magnetic moment $M_t$ depends primarily on the length of time and magnitude of the applied excitation field $B_1$ and its frequency.

The practical value of this phenomenon resides in the signal which is emitted by the excited spins after the excitation signal $B_1$ is terminated. In simple systems the excited nuclei induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the signal decays, at least in part due to dephasing of the aligned precession of the spins after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest. If the net magnetic moment M is not given sufficient time to relax to its equilibrium value, the amplitude A of the NMR signal produced in a subsequent pulse sequence will be reduced.

The NMR measurements of particular relevance to the present invention are called "pulsed NMR measurements". Such NMR measurements are divided into a period of RF excitation and a period of signal emission and acquisition. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, frequency content, phase and duration. Such RF excitation pulses may have a narrow frequency spectrum (selective excitation pulse), or they may have a broad frequency spectrum (nonselective excitation pulse) which can produce transverse magnetization $M_t$ over a range of resonant frequencies. The prior art is replete with RF excitation techniques that are designed to take advantage of particular NMR phenomena and which overcome particular problems in the NMR measurement process.

More recently NMR techniques have been developed which place additional stringent requirements on the RF transmitters. Some methods such as phase spoiled steady state sequences require that the phase of successive RF excitation pulses be shifted by programmed amounts, and other methods such as the use of fast passage inversion pulses require that the RF excitation pulses be phase modulated by a predefined waveform. Still other methods such as multi-planar imaging require that the carrier frequency of successive RF excitation pulses be changed in a programmed pattern, and still other methods which use variable rate excitation pulses require that the RF excitation pulse be frequency modulated. Other methods, such as offset field of view imaging, require that the frequency of the reference signal used to demodulate the received NMR signal be frequency offset with respect to the Larmor frequency, or phase offset by programmed amounts from sequence to sequence. All of these methods have the common requirement that the relative phase of the carrier signal used to produce the RF excitation have a consistent or known phase relationship to the reference signal used to demodulate the received NMR signals. If the synthesizer signals used in the multiple sequences that generate an NMR data set do not have this phase consistency, the quality of the data will be degraded. Prior synthesizers are not able to provide this versatility while maintaining phase consistency, or can do so only with great inconvenience.

SUMMARY OF THE INVENTION

The present invention relates to a transceiver for an NMR instrument which accurately generates RF reference signals and excitation pulses that can be easily changed in frequency or phase and which can be amplitude, frequency or phase modulated without loosing phase consistency. More specifically, the invention includes a digital synthesizer in which a carrier signal is produced by addressing and reading out a succession of digital numbers in a look-up table and converting them to an analog signal, the addressing means includes a first digital accumulator which receives at its input a digital carrier frequency number that determines the rate at which the output of the first digital accumulator changes, a digital adder which receives at one input the output of the first digital accumulator and which receives at a second input a digital phase number, the output of the digital adder being coupled to the look-up table storage to address the digital numbers stored therein. In another aspect of the invention, a second digital accumulator receives at its input a digital frequency number that determines the rate at which the output of the second digital accumulator changes and a second digital adder which arithmetically sums the digital numbers at the outputs of the two digital accumulators and applies the sum to the first digital adder.

A general object of the invention is to provide an RF signal for an NMR instrument which can be precisely controlled in both frequency and phase. By employing a digital accumulator to drive the address input to the stored digital representation of the carrier signal in the look-up table, the frequency at which the RF carrier signal is produced can be precisely determined by the digital carrier frequency number. The phase of the RF carrier signal can be quickly and precisely altered by the digital phase number which alters the address which is input to the look-up table storage by a corresponding amount. Similarly, the frequency of the RF carrier signal can be switched to different values, or it can be modulated precisely by time varying digital frequency numbers that are input to the second digital accumulator, while maintaining phase consistency with respect to the original frequency and phase. The outputs of both digital accumulators are digitally added together to determine the addressed location in the look-up table storage, which in turn determines the frequency of the generated RF carrier signal.

Another general object of the invention is to alter the phase or frequency of the RF carrier signal without loosing phase consistency. When the phase is altered by applying a digital phase number, the original phase of the RF carrier signal can easily be restored by simply changing the digital phase number back to its original, unaltered value. Similarly if the frequency of the RF carrier signal is altered by applying a digital frequency number to the second accumulator, the phase and frequency of the original, unaltered RF carrier signal is restored by removing the digital frequency number and resetting the output of the second digital accumulator.

Another object of the invention is to generate a high frequency RF carrier signal under digital control. The signal read out of the look-up table and converted to analog form is at a frequency which is reasonably attainable using state-of-the-art commercially available components. This digitally produced carrier signal is then shifted to the desired Larmor frequency by mixing it with high frequency reference signals and filtering out all but the desired sideband.

A more specific object of the invention is to provide a transceiver for an NMR instrument in which phase consistency is maintained between the RF transmitter and RF receiver by using a single digital synthesizer. The RF carrier signals applied to both the modulator in the RF transmitter section and to the demodulator in the RF receiver section are under digital control. Any phase change in the received NMR signal is thus accurately detected.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
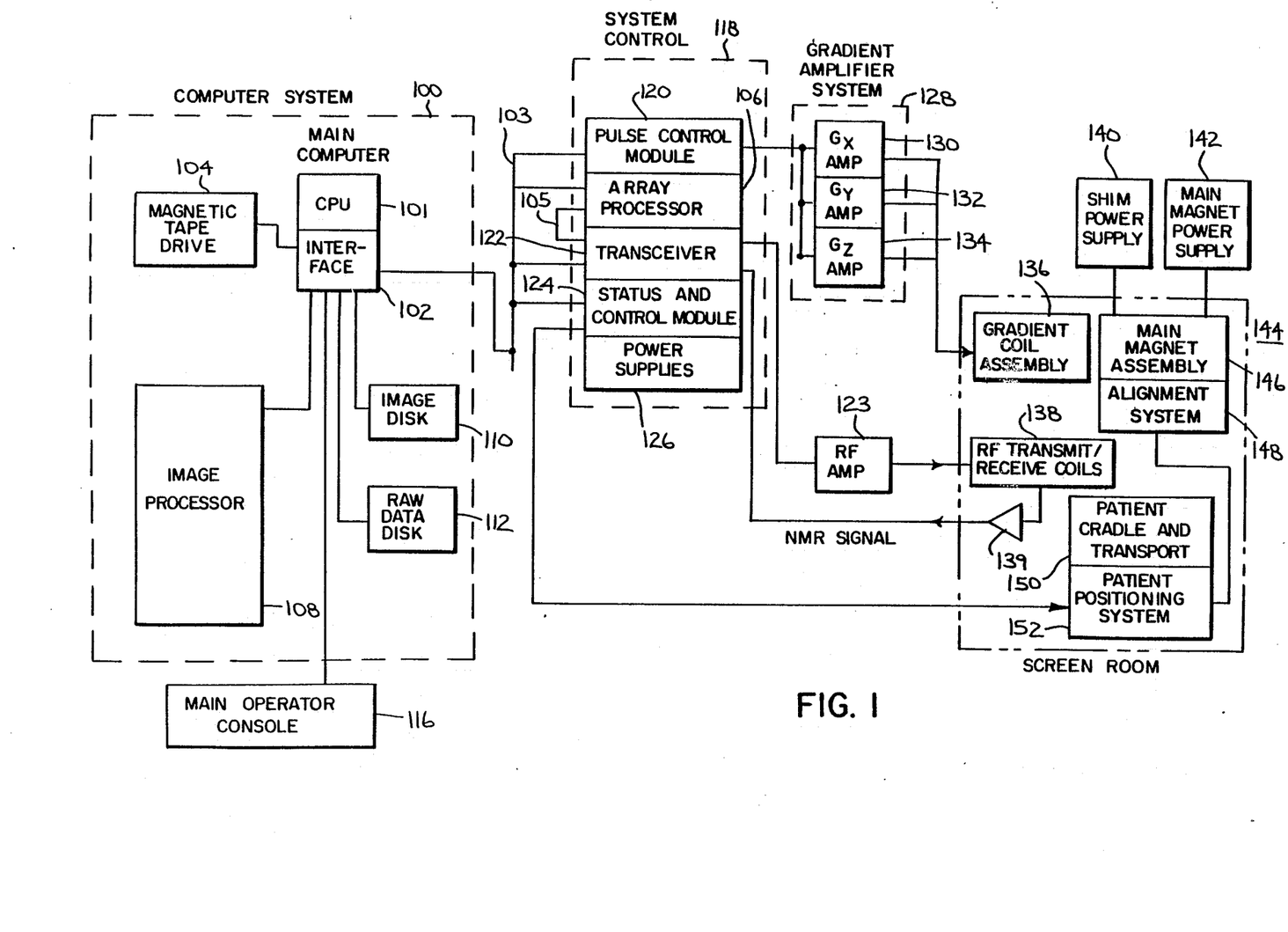
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV4000). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 36 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
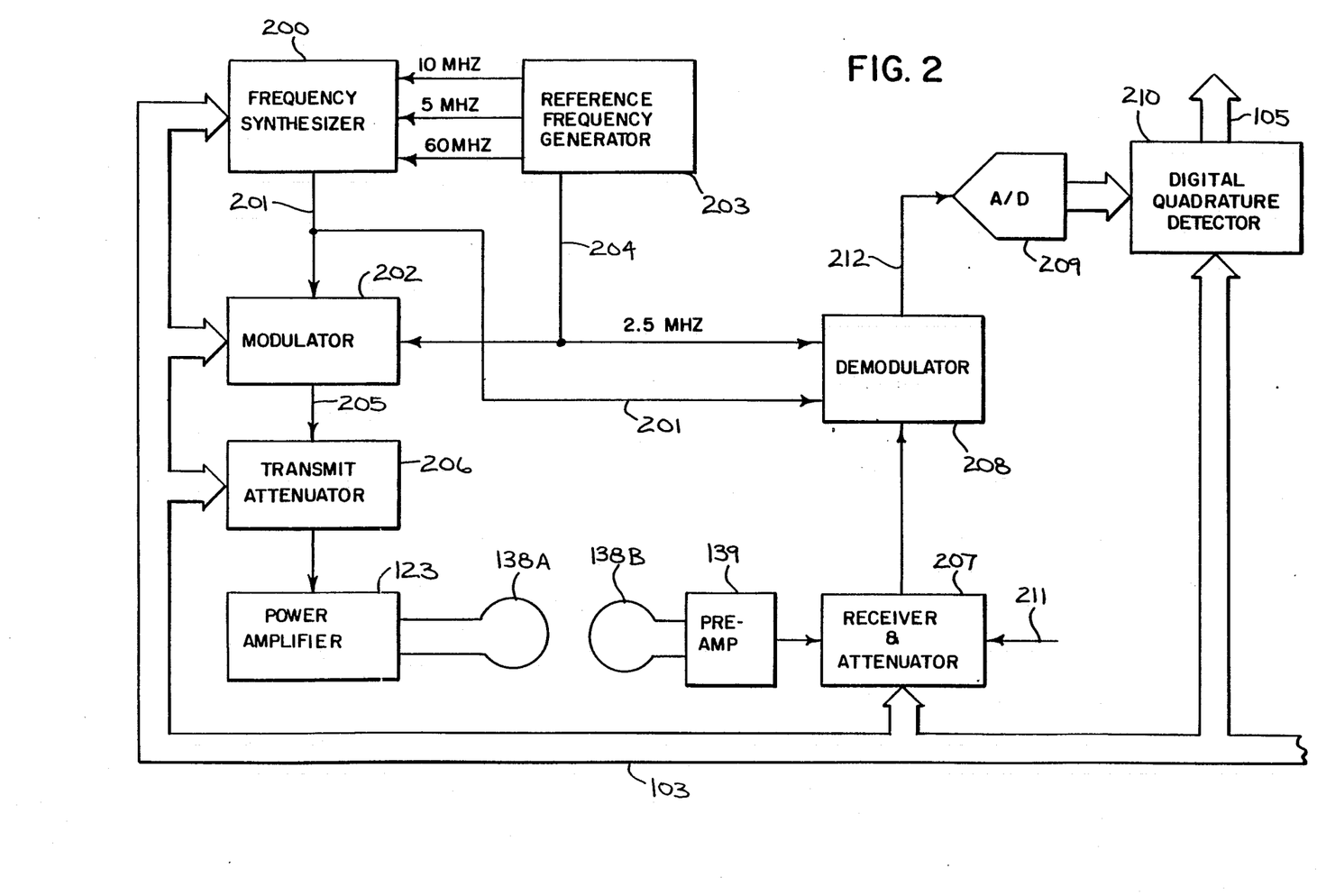
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201.

Figure 3:
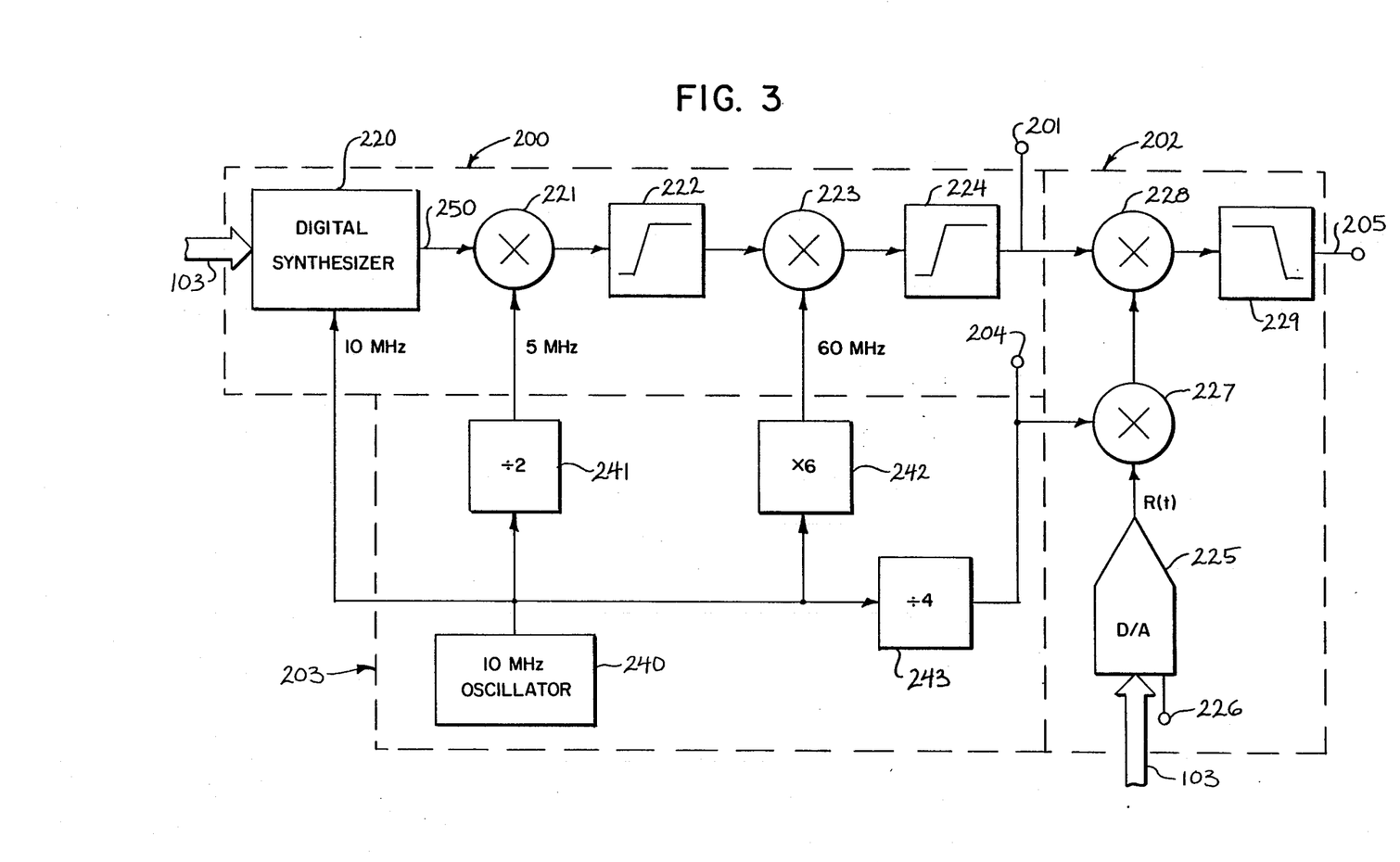
FIG. 3 is an electrical block diagram of the frequency synthesizer, reference frequency generator and modulator which form part of the transceiver of FIG. 2.

The transmitter section of the transceiver 122 is shown in more detail in FIG. 3. There are a number of requirements that distinguish this RF transmitter from conventional RF transmitters. First, the RF transmitter operates at a very high frequency (i.e. the Larmor frequency), but it operates over a very narrow range of frequencies. Its frequency must be very precisely controlled ($\pm 1$ Hz), and its frequency must be capable of being modulated by a waveform and of being switched quickly to a different frequency ($\pm 300$ kHz). Similarly, the phase of the RF carrier must be precisely controlled ($\pm \frac{1}{2}°$), and its phase must be capable of being modulated by a waveform and of being switched quickly to a different value (0°-360°). Phase consistency must be maintained between the transmitted and received RF signals so that phase information is not distorted or lost. As is well known, the phase changes are employed in the NMR image reconstruction algorithms to locate the physical position of the objects in the reconstructed image. Loss of phase information does not, therefore, merely result in a distortion of image intensity, but rather, it causes a misplacement of objects in the image which makes the image virtually useless. In NMR imaging and spectroscopy, signal averaging is used to reduce the effects of noise. If phase consistency is not maintained, the various signals being averaged will not be coherent and signal loss will result.

Referring particularly to FIGS. 2 and 3, the frequency synthesizer 200 produces an RF carrier which has the desired frequency and phase. This is accomplished by generating a relatively low frequency signal 0.91 to 1.9975 MHz) in a digital synthesizer 220 which is capable of very accurately controlling frequency and phase as will be described in more detail below. The digital synthesizer output is then mixed with a 5 MHz reference sine wave from the reference frequency generator 203 at a mixer 221 and the lower sideband is filtered out by a band pass filter 222. The mixer 221 is a ring diode, double balanced mixer commercially available from Minicircuits Inc. as model TFM-2, and the filter 222 is a bandpass filter tuned to pass frequencies from 5.91 MHz to 6.9975 MHz.

The 6 to 7 MHz signal which is output by the filter 222 is then mixed with a 60 MHz reference sine wave which is also produced by the reference frequency generator 203. This is done in a mixer 223 which is identical to mixer 221, and the resulting upper sideband is passed by a bandpass filter 224 which is tuned to pass 65.91 MHz to 66.9975 MHz. The resulting 66 MHz to 67 MHz sine wave is the RF carrier signal on line 201.

Referring still to FIGS. 2 and 3, the RF carrier signal on line 201 is input to the modulator 202 where it is amplitude modulated by a waveform derived from R(t) which is input through the link 103 to a 16-bit digital to analog converter 225. The 16-bit values of R(t) are received from the pulse control module 120 (FIG. 1) and are clocked into the D/A converter 225 by a 1 MHz clock signal which is also received from the pulse control module through clock line 226. The R(t) analog signal which is output from the D/A converter 225 may be, for example, a sinc or a square waveform which are commonly used in NMR measurements and it typically has a duration of from 0.5 to 10 milliseconds.

Before being mixed with the RF carrier on line 201, the modulation envelope R(t) is mixed with a 2.5 MHz reference sine wave from the reference frequency generator 203 in a mixer 227. The resulting signal is then mixed with the RF carrier signal in a mixer 228 and the resulting modulated RF signal is filtered at 229 to remove all but the lower sideband. The filter 229 is a low pass filter tuned to 66 MHz.

Referring still to FIG. 3, it should be apparent that all of the reference signals employed by the transceiver 122 are easily derived from a single 10 MHz oscillator 240 located in the reference frequency generator 203. The 10 MHz clock is used directly by the digital synthesizer 220 and the 5 MHz reference signal is produced by a divide-by-two circuit 241. The 60 MHz reference signal is produced by a times-two and a times-three circuit which are cascade connected to provide a times-six circuit indicated at 242. And finally, the 2.5 MHz reference signal is produced by two divide-by-two circuits which collectively divide the 10 MHz reference by four as indicated at 243.

Figure 4:
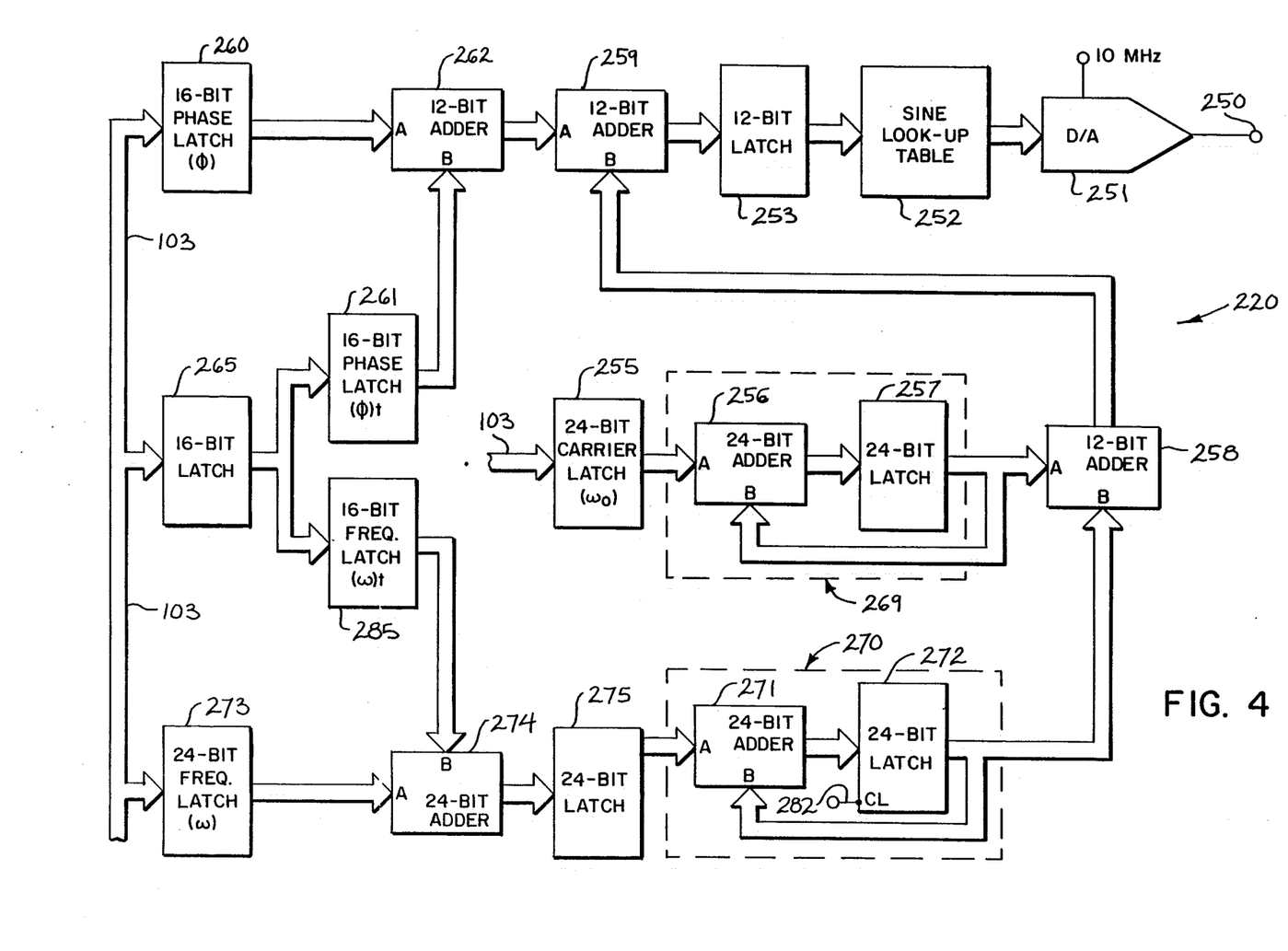
FIG. 4 is an electrical schematic diagram of the digital synthesizer which forms, part of the frequency synthesizer of FIG. 3.

Referring particularly to FIG. 4, the digital synthesizer 220 has a number of inputs from the link 103 which enable digital numbers to be input to control the frequency and phase of the analog sine wave signal which is output at 250 by a 12-bit digital-to-analog converter 251. The sine wave is produced from a sequence of 12-bit digital numbers that are stored in a programmable read-only memory 252 and are addressed by a 12-bit number produced by a latch 253. As the latch 253 applies progressively higher addresses to the memory 252, successive stored digital values are read out and applied to the input of the D/A converter 251. When sequentially addressed at a constant rate, the memory 252 "plays out" one complete period of a sine wave. The frequency ($\omega_c$) of the sine wave is determined by the rate at which the memory address increases and the phase ($\phi$) of the sine wave at any moment in time is determined by the address applied by the latch 253, as indicated by the following formula:

$$\phi = 360(applied\ address)/4096 \qquad (1)$$

For example, if latch 253 were to sequentially contain all possible 12-bit numbers in ascending order and these switched at a 10 MHz rate, then the output of D/A converter 251 would be a sine wave at a frequency of 10/4096=0.00244 MHz or 2.44 kHz. However, if the output of the latch took on values from zero to roughly 4095 in increments larger than one, the output at 250 would be at a proportionally higher frequency. For example, if the values went from zero to 4092 in steps of 4 at a 10 MHz rate, the frequency would be 9.775 kHz. Thus, the value at latch 253 is changed at a constant rate (e.g. 10 MHz), and the amount by which the value changes per clock cycle determines the sine wave frequency.

The digital synthesizer 220 provides a number of features which enable precise control of frequency ($\omega$) and phase ($\phi$), but to better understand its operation, a very simple example will be explained first in which a constant sine wave at a constant carrier frequency is to be produced. In such case, a 24-bit carrier number is loaded into a carrier latch 255 from the data link 103. This carrier number represents a base, or carrier frequency ($\omega_o$) that will be produced by the digital synthesizer. When modulated as described above, it will produce RF excitation pulses and demodulation reference signals. The digital synthesizer base frequency $\omega_o$ is given by the following expression.

$$\omega_o = \text{(carrier number)} (10 \text{ MHz})/2^{24} \quad (2)$$

The carrier number is applied to the input of a digital accumulator that is formed by a 24-bit digital adder 256 and a 24-bit latch 257. An adder such as the model 74F283 commercially available from Fairchild, Inc. and a latch such as model 74AS874 commercially available from Texas Instruments, Inc. are employed in the preferred embodiment. The digital accumulator operates at a rate of 10 MHz to add the carrier number to itself and apply the twelve most significant bits of the sum to the input of a 12-bit adder 258. The adder 258 is, in turn, connected to one input of a second 12-bit adder 259, and its output is stored in the 12-bit latch 253. As will be explained below, the second input of adder 258 is employed to change the frequency of the generated sine wave, and the second input of adder 259 is employed to change the phase of the generated sine wave. Both of these second inputs are assumed to be zero at the moment. As a result, the output of the digital accumulator 257 is applied to the 12-bit latch 253 and it is steadily increased in value at a rate determined by the size of the carrier number in the latch 255. As the carrier number is repeatedly added to itself, at some point the result will exceed the 24-bit word depth of the adder 256. When this happens, the "carry" bit is discarded and only the lower 24 bits are retained. As a result, at latch 253, numbers will be seen to increase, approach 4096 in value, and then wrap around to zero. This is exactly as desired since look-up table 252 contains exactly one period of a sine wave. The sine wave will thus be "played out" of the memory 252 at the desired, fixed frequency.

The phase of the generated sine wave can be shifted at any moment in time by applying a 12-bit number to the "A" input of the second adder 259. There are two means available for shifting the phase, a 16-bit phase latch 260 which receives a 16-bit phase number ($\phi$) from the line 103, and a 16-bit phase latch 261 which receives a sequence of phase shift numbers as a function of time ($\phi$)t. Because of the 16-bit word size, the phase $\phi$ (in degrees) is related to the values in latches 260 and 261 as follows:

$$\phi = 360 \text{ (Value)}/65536 \quad (1b)$$

The twelve most significant outputs of latches 260 and 261 are added together by a 12-bit adder 262 so that either, or both, can be applied to the second adder 259 to alter the phase of the generated sine wave. For example, in the multi-echo CPMG pulse sequence, the phase of the 180° RF echo pulses are shifted by 90° from the phase of the 90° RF excitation pulses which generate the transverse magnetization $M_t$. This phase shift is easily accomplished with the digital synthesizer of the present invention by loading a phase number ($\phi$) into the latch 260 which will immediately advance the address being applied to the sine look-up table memory 252. As indicated by equation (1b) above, a 90° phase shift is accomplished with a phase number $\phi$ of 16384. The phase shift can then be removed for the following pulse sequence execution by loading a zero back into the phase latch 260.

Figure 5A:
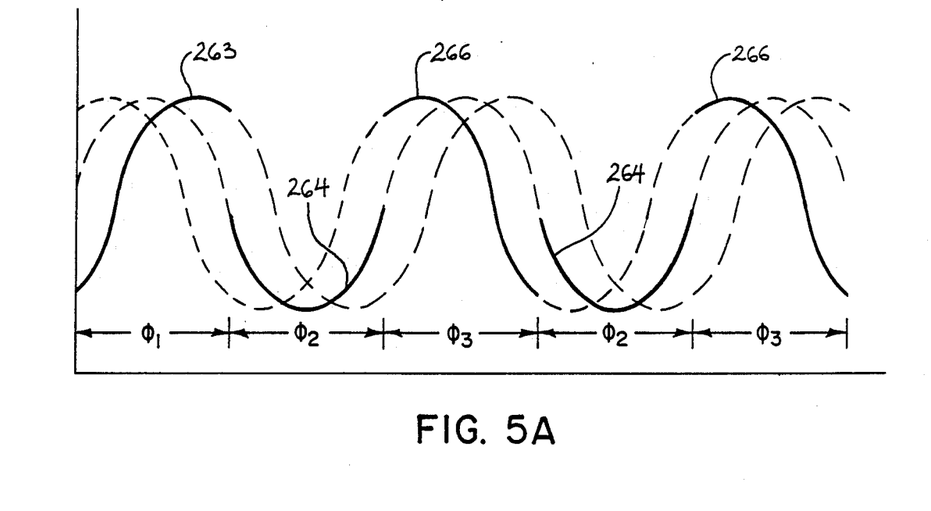
FIGS. 5a and 5b are graphic representations of the signals produced by the digital synthesizer of FIG. 4.

In addition to shifting the phase of the RF Carrier signal, the digital synthesizer 220 maintains phase coherency throughout a series of phase shifts. This is illustrated in FIG. 5a where three different RF carrier signals indicated by the solid lines 263, 264 and 266 are produced during successive time intervals and then signals 264 and 266 are repeated. The three RF carrier signals 263, 264 and 266 have the same frequency, but they are offset in phase by loading different phase numbers $\phi_1$, $\phi_2$ and $\phi_3$ in the phase latch 260. Phase coherence is shown by the dotted lines which reveal that, for example, when the phase number $\phi_2$ is loaded into the latch 260 or reloaded at a later time, the resulting RF carrier signal 264 continues with the same phase as if it had been generated continuously.

The phase of the generated sine wave can be phase modulated by a waveform $\phi(t)$ which is written to the phase latch 261 by the pulse control module 120 at a rate of 1 MHz during the generation of an RF excitation pulse. The 16-bit numbers produced by the pulse control module 120 are loaded into a 16-bit latch 265 that connects to the link 103, and these numbers are, in turn, loaded into the phase latch 261. The latch 265 enables the numbers asynchronously generated at the 1 MHz rate by the pulse control module 120 to be synchronously loaded into the phase latch 261. This phase modulation is useful when executing "complex" excitation pulses, such as hyperbolic secant pulses used to invert longitudinal magnetization.

It should be apparent that the present invention enables one to precisely control the phase of the RF excitation pulses to carry out many different NMR measurements. The phase of the RF excitation pulses can be precisely shifted from one pulse to the next, and the phase of the RF carrier can be shifted, swept, or otherwise modulated during the production of the RF excitation pulse.

Although the frequency of the output 250 can be changed from $\omega_o$ using a suitable phase waveform $\phi(t)$, greater ease of use and flexibility is provided by the use of a second digital accumulator. Referring still to FIG. 4, whereas the center, or base frequency, $\omega_o$, is determined by the carrier number in the latch 255 and its associated digital accumulator 269, which drives the A input of the first adder 258, this frequency can be changed by the output of a second digital accumulator 270 which drives the B input of the adder 258. That is, the frequency of the RF carrier is determined by the sum of the rate at which the first digital accumulator advances the addressing of the stored sine wave, plus the rate at which the second digital accumulator advances the addressing sequence. The second digital accumulator 270 is identical to the accumulator 269 and includes a 24-bit adder 271 and a 24-bit latch 272.

The base frequency ($\omega_o$) may be augmented by a fixed amount as determined by a 24-bit frequency number which is loaded into a latch 273 from the link 103. The latch 273 connects to the A inputs on an adder 274 and the output of the adder 274 is coupled to the input of the second digital accumulator 270 through a timing latch 275. The value of the frequency number increases the carrier frequency ($\omega_o$) by an amount $\omega$ in accordance with the following expression:

$$\omega_c = \omega_o + \omega$$

$$\omega = (\text{frequency number}) (10 \text{ MHz})/2^{24} \quad (3)$$

Figure 5B:
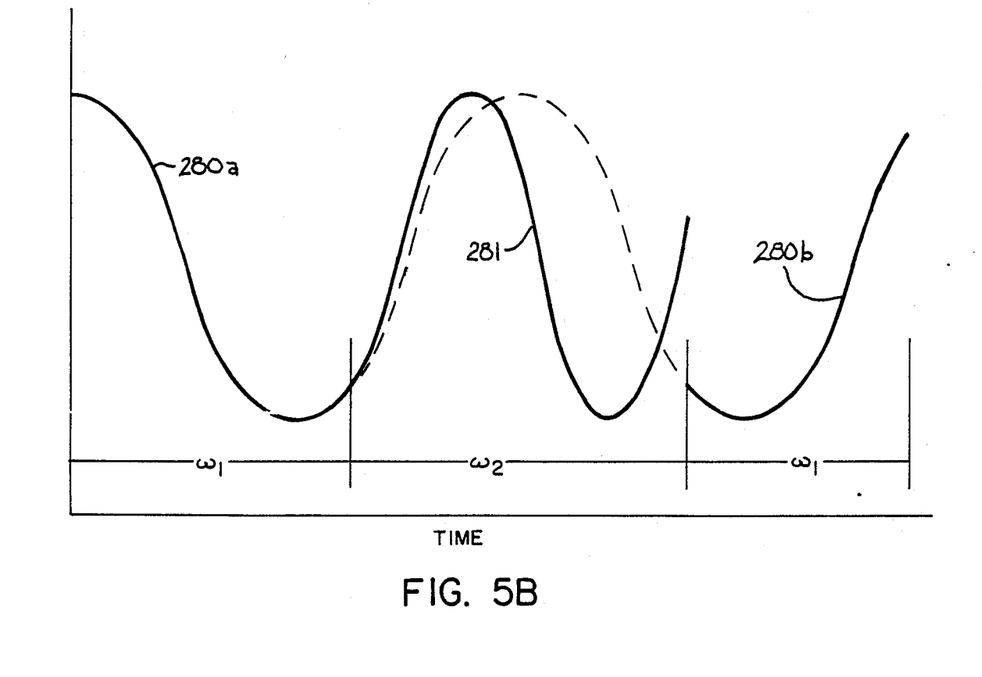

It should be apparent therefore that the frequency of successive RF excitation pulses can be easily switched to any value within the operating range of the digital synthesizer 220 by loading a different number into the latch 273. Less apparent, and very important for NMR experiments, is the fact that when the RF carrier is switched back to the center frequency by loading a zero into the frequency latch 273 and clearing the second accumulator 270 through control line 282, the system "remembers" the phase and frequency of the center frequency signal and the original sine wave is produced as if it had never been switched off. This is illustrated in FIG. 5b where the solid lines 280 and 281 indicate the output of the digital synthesizer 220 at two frequencies ($\omega_1 = \omega_0$ and $\omega_2 = \omega_0 + \omega$) over separate time intervals. The dotted lines illustrate that phase coherency is maintained, for example, between the generated segments 280a and 280b of the waveform at frequency $\omega_1$.

Some of the features and flexibility of the synthesizer may be better understood by consideration of the following application to NMR imaging. Suppose it is desired to execute a two interleaved slices, one echo imaging experiment. Let the two slices be referred to as A and B. Suppose further that it is desired for the image of slice B to have its image center shifted by 5 cm. in the so-called frequency encoded direction. Computer 100 precalculates a waveform $R_{90}(t)$ such that when $R_{90}$ is used to amplitude modulate a 90° pulse in the presence of a slice selection gradient, a slice with the desired slice thickness is excited. Also precalculated are values $\omega_{A,90}$ and $\omega_{B,90}$ selected so that in the presence of the selection gradient for the 90° pulse, NMR excitation at the proper slice location would result for slice A and slice B, respectively. The way in which this is done is well known in the art. Another waveform $R_{180}(t)$ is calculated that will be used to amplitude modulate the 180° pulses in the presence of their selection gradient. Similarly, offset frequencies $\omega_{A,180}$ and $\omega_{B,180}$ for the 180° pulses are calculated. Carrier latch 255 is loaded so that after the previously described modulation (by modulators 221, 223 and 228), an RF carrier at the Larmor frequency of the system would be produced at 205.

To excite slice A, $\omega_{A,90}$ is loaded into latch 273 and latch 272 is cleared. To produce a spin-echo for slice A, $\omega_{A,180}$ is loaded into latch 273 and latch 272 is cleared. To properly demodulate the received signal from slice A, a value $\omega_{A,r}$ is loaded into latch 273 and latch 272 is cleared. $\omega_{A,r}$ is chosen to map the center of the image signal spectrum to the center of the bandwidth of the receiver. For the receiver of FIG. 2 previously described, $\omega_{A,r}$ corresponds to 187.5 kHz. Note that due to the use of the second accumulator for all frequency shifts and the clearing of latch 272, all synthesizer signals are phase referenced to the first accumulator. Thus, at any later time the above sequence can be repeated and the resulting signal will be phase consistent with that of this first sequence.

To examine slice B the above steps are repeated except that $\omega_{B,90}$ and $\omega_{B,180}$ are used during the 90° and 180° pulses. For signal reception for slice B, a value $\omega_{B,r}$ is loaded into latch 273 and latch 272 is cleared. $\omega_{B,r}$ is selected so that in the presence of the read-out gradient, the pixel location corresponding to the desired image center is mapped to the center of the receiver's bandwidth. For example, with a readout gradient strength of 1.0 Gauss per cm., a one cm. shift corresponds to 4.258 kHz. Thus, a 5 cm. shift would be accomplished with $\omega_{B,r} = 187.5 + (4.258)(5) = 208.79$ kHz.

It will be clear to those skilled in the art that RF excitation pulses equivalent to those generated above could also be produced with a conventional single side band modulator. However, such a modulator would require 2 waveforms such as $R_{90}(t)$ for each slice and 2 waveforms such as $R_{180}(t)$ for each slice. If a large number of slices are to be imaged, the memory requirements can be significant. Further, the output of a single side band modulator is degraded if the quadrature adjustment is not perfect and/or due to carrier leakage. The present approach has at least all the flexibility of a single side band modulator without its disadvantages.

Shifting the image center in the read-out direction can be accomplished in prior art systems through the use of 2 conventional synthesizers. However, to insure phase consistency, the NMR instrument would have to be triggered at a consistent phase difference between the two synthesizers' output, as is taught in U.S. Pat. No. 4,593,247, assigned to the same assignee as the present invention.

The synthesizer of FIG. 4 also enables the shifting of the image in the so-called phase encoded direction. This is done by loading a different phase shift value into latch 260 during signal reception for each view. As is well known, shifting the image corresponds to a linear phase shift in the NMR raw data. This phase shift can be inserted into the data by phase shifting the signal used to demodulate the NMR signal. For shifting the image in the phase encoded direction, each view incorporates a phase shift proportional to the view number (or phase encoding amplitude) and also proportional to the image shift in pixels. A phase shift of 180° per view corresponds to a spatial shift of ½ of the field of view. A smaller spatial shift is accomplished by a proportionally smaller shift in phase per view. For example, a shift of one-tenth of the field of view is accomplished by shifting the receiver's reference signal by $(1/10)(180)/(\frac{1}{2}) = 36°$ per view. The view with no phase encoding would use no phase shift. The view with the smallest positive phase encoding would be received with a phase shift of 36° which is loaded into latch 260. The next most positive view would be acquired with a receiver phase shift of 72°, and so on. Negative phase encoding views are received with negative phase shifts. Negative image shifts (i.e. shifts in the opposite direction) are accomplished by negative phase shifts per view.

The flexibility of the present invention is also useful in a technique referred to as spoiled steady state imaging. In this rapid imaging technique, excitation pulses are applied with repetition times short compared to $T_1$ and $T_2$. Image contrast can be affected by not allowing the transverse magnetization to reach a steady state equilibrium. This can be done by altering the phase of the excitation pulses as discussed by Crawley, Wood, and Hankelman in *Mag. Res. Med.*, Vol. 8, p. 248, 1988. The present synthesizer readily accommodates this. If the phase of the excitation pulse is altered, the signal received in that view will also be altered by the same amount. With the present invention, this unwanted phase shift in the signal can be removed by shifting the phase of the synthesizer during signal reception by the same amount that the phase of the excitation pulse was altered.

In addition to enabling different frequencies to be produced, the digital synthesizer enables the RF carrier signal to be frequency modulated by a waveform $\omega(t)$ which is produced by the pulse control module 120. This wave form $\omega(t)$ is played out during the generation of an RF excitation pulse by loading a series of 16-bit frequency numbers to the latch 265 at up to a 1MHz rate and latching them in a 16-bit latch 285. The output of this latch 285 drives the B inputs on the adder 274 so that the value of the frequency modulating waveform $\omega(t)$ is added to the fixed frequency value ($\omega$) to proportionately alter the carrier frequency as follows:

$$\omega_c = \omega_0 + \omega + \omega(t) \qquad (4)$$

Of course, phase coherency is maintained throughout, so that when the frequency modulating waveform terminates, the RF carrier resumes at a frequency and phase as though the frequency modulation had never been applied.

This feature of the synthesizer is useful in a method called variable rate excitation. In this technique, described by Conolly, Nishimura, Macovski and Glover in *J. Mag. Res.*, Vol. 78, p. 440, 1988, a modified RF pulse is played out in the presence of a time varying magnetic field gradient. Benefits of this technique include lower power requirements and/or improved slice profiles. However, excitation of slices away from the center of the gradient coil with conventional synthesizers is complicated due to the fact that the resonant frequency at the desired slice location is time varying in the presence of the time varying field gradient. The present invention makes implementation of such techniques much simpler due to the ability to accurately control the frequency offset of the pulse during excitation. With the present synthesizer, a waveform $\omega(t)$ is loaded as a series of numbers into latch 265, where $\omega(t)$ is given by:

$$\omega(t) = \gamma G(t) Z_0$$

where:
$Z_0$ the slice offset;
$\gamma$ is the magnetogyric constant of the spins; and
$G(t)$ is the time varying magnetic field gradient.

It should be apparent to those skilled in the art that many variations can be made from the preferred embodiment of the invention described above without departing from the spirit of the invention. Therefore, reference is made to the following claims which define the scope of the invention.

We claim:

1. A frequency synthesizer for an NMR instrument which comprises:
   look-up table storage means for storing at successive addressable locations a digital representation of a carrier signal;
   digital-to-analog converter means connected to receive the digital representation of the carrier signal read-out of the look-up table storage means and convert it to an analog carrier signal;
   a digital adder having an output which produces a digital number that is the arithmetic sum of digital numbers applied to its first and second inputs, the output of the digital adder being coupled to the look-up table storage means to address the locations therein;
   a phase latch for storing a digital phase number and for applying the digital phase number to one of the digital adder inputs; and
   a digital accumulator for continuously adding a digital carrier frequency number which is applied to its input and generating the accumulated digital number at its output, the output of the digital accumulator being coupled to the other of the digital adder inputs;
   wherein the addresses applied to the look-up table storage means are advanced at a rate determined by the digital carrier frequency number to thereby produce an analog carrier signal at the output of the digital-to-analog converter which has a frequency that is determined by the digital carrier frequency number, and wherein the phase of the analog carrier signal is determined by the digital phase number.

2. The frequency synthesizer as recited in claim 1 which further includes:
   a second digital adder having an output connected to said one of the digital adder inputs and which produces a digital number that is the arithmetic sum of the digital phase number that is applied to one of its inputs and a digital phase modulation number that is applied to the other of its inputs; and
   phase modulation means for producing a sequence of digital phase modulation numbers and applying them to the other input of the second digital adder during the generation of the analog carrier signal, such that the analog carrier signal is modulated in phase as a function of time.

3. The frequency synthesizer as recited in claim 1 in which the RF carrier signal is mixed with one or more RF reference signals to increase its frequency to the Larmor frequency of the NMR instrument.

4. A frequency synthesizer for an NMR instrument which comprises:
   look-up table storage means for storing at successive addressable locations a digital representation of a carrier signal;
   digital-to-analog converter means connected to receive the digital representation of the carrier signal read-out of the look-up table storage means and convert it to an analog carrier signal;
   a digital adder having an output which produces a digital number that is the arithmetic sum of digital numbers applied to its first and second inputs, the output of the digital adder being coupled to the look-up table storage means to address the locations therein;
   a first digital accumulator for continuously adding a digital carrier frequency number which is applied to its input and generating the accumulated digital number at its output, the output of the digital accumulator being coupled to one of the digital adder inputs; and
   a second digital accumulator for continuously adding a digital frequency number which is applied to its input and generating the accumulated digital number at its output, the output of the second digital accumulator being coupled to the other of the digital adder inputs;

wherein the addresses applied to the look-up table storage means are advanced at a rate determined by the sum of said digital carrier frequency number and the digital frequency number to thereby produce an analog carrier signal at the output of the digital-to-analog converter which has a frequency that is determined by the sum of the digital carrier frequency number and the digital frequency number.

5. The frequency synthesizer as recited in claim 4 in which the carrier signal is mixed with one or more RF reference signals to increase its frequency to the Larmor frequency of the NMR instrument.

6. The frequency synthesizer as recited in claim 4 which further includes:

a second digital adder having an output connected to the input of the second digital accumulator and which produces a digital number that is the arithmetic sum of the digital frequency number that is applied to one of its inputs and a digital frequency modulation number that is applied to the other of its inputs; and frequency modulation means for producing a sequence of digital frequency modulation numbers and applying them to the other input of the second digital adder during the generation of the analog carrier signal, such that the analog carrier signal is modulated in frequency as a function of time.

* * * * *